(12) United States Patent
Sasaki et al.

(10) Patent No.: US 12,596,043 B2
(45) Date of Patent: Apr. 7, 2026

(54) PRESSURE SENSOR AND MANUFACTURING METHOD FOR THE SAME

(71) Applicant: InvenSense, Inc., San Jose, CA (US)

(72) Inventors: Yoshitaka Sasaki, Uniondale, NY (US); Jotaro Akiyama, Minami (JP); Sal Akram, San Jose, CA (US); Yaoching Wang, San Jose, CA (US); Wang Shen Su, Hsinchu City (TW); Tsung Lin Tang, Kaohsiung City (TW); Ting-Yuan Liu, Zhubei City (TW); Yuki Shibano, Tokyo (JP); Chung-Hsien Lin, Hsinchu (TW)

(73) Assignee: InvenSense, Inc., San Jose, CA (US)

( * ) Notice: Subject to any disclaimer, the term of this patent is extended or adjusted under 35 U.S.C. 154(b) by 374 days.

(21) Appl. No.: 18/113,541

(22) Filed: Feb. 23, 2023

(65) Prior Publication Data

US 2023/0296461 A1 Sep. 21, 2023

Related U.S. Application Data

(60) Provisional application No. 63/313,962, filed on Feb. 25, 2022.

(51) Int. Cl.
*G01L 9/12* (2006.01)
*B81C 1/00* (2006.01)

(52) U.S. Cl.
CPC ............ *G01L 9/12* (2013.01); *B81C 1/00198* (2013.01); *B81C 2201/0132* (2013.01)

(58) Field of Classification Search
CPC ....................................................... G01L 9/12
See application file for complete search history.

(56) References Cited

U.S. PATENT DOCUMENTS

| | | | |
|---|---|---|---|
| 5,583,296 A | 12/1996 | Mokwa et al. | |
| 6,877,383 B2 * | 4/2005 | Horie | G01L 9/0073 73/754 |
| 6,945,115 B1 * | 9/2005 | Wang | G01L 9/0073 73/718 |
| 2005/0132814 A1 | 6/2005 | Satou et al. | |
| 2007/0196946 A1 | 8/2007 | Kasai et al. | |
| 2017/0349430 A1 | 12/2017 | Sato | |
| 2018/0226934 A1 | 8/2018 | Ashida et al. | |
| 2018/0327257 A1 * | 11/2018 | Feyh | G01L 9/0073 |
| 2021/0270687 A1 * | 9/2021 | Chiu | G01L 9/0072 |

FOREIGN PATENT DOCUMENTS

JP          2015152457 A          8/2015

* cited by examiner

*Primary Examiner* — Kristina M Deherrera
*Assistant Examiner* — Jean F Morello
(74) *Attorney, Agent, or Firm* — Van Hoven PC; Joshua Van Hoven

(57) ABSTRACT

A pressure sensor includes a first electrode, a plurality of cavities, and a second electrode. The second electrode is disposed opposite the first electrode through the plurality of cavities. The second electrode includes a flat structure spanning two adjacent cavities of the plurality of cavities.

20 Claims, 16 Drawing Sheets

PRESSURE SENSOR AND MANUFACTURING METHOD FOR THE SAME

CROSS REFERENCE TO RELATED APPLICATIONS

This application claims the benefit of U.S. Provisional Patent Application No. 63/313,962 filed on Feb. 25, 2022, the entire contents of which are incorporated herein by reference in their entirety.

FIELD

The present disclosure relates to a capacitive pressure sensor with high stability, and a manufacturing method for the same.

BACKGROUND

Capacitive pressure sensors are known as high-precision pressure sensors. Some known capacitive pressure sensors include MEMS devices that are configured so that the capacitance between two electrodes changes due to pressure changes in a membrane. The pressure may be detected by measuring the capacitance converted into a voltage by a detection circuit connected to the capacitive pressure sensor.

Applications for capacitive pressure sensors include, for example, touch sensors for smartphones, sensors for semiconductor mass flow controllers, sensors for industrial robots, and security sensors for home security and other applications. Security sensors may include sensors for cleaning robots, security sensors for jewelry and precious metals, sensors for automatic driving, and safety monitoring sensors for semiconductor devices, as examples.

Generally, two electrodes of a capacitive pressure sensor face each other with a cavity in between. For example, at least one of the two electrodes can be formed using a polysilicon membrane, e.g., as disclosed in U.S. Pat. No. 5,583,296 A, U.S. Patent Application Publication 2005/0132814 A1 and U.S. Patent Application Publication 2018/0226934 A1.

In other known approaches, e.g., as disclosed in U.S. Pat. No. 5,583,296 A, U.S. Patent Application Publication 2005/0132814 A1 and U.S. Patent Application Publication 2018/0226934 A1, the polysilicon membrane disposed above the cavity may be formed over a sacrificial layer to form the cavity. The sacrificial layer has a step. In the vicinity of the step, crystals of the polysilicon membrane grow in tilted directions and grow to different grain sizes. This may decrease mechanical strength of the polysilicon membrane. In addition, when etching for a long time to remove the sacrificial layer, the etchant may penetrate into the grain boundaries of the polysilicon membrane, resulting in a decrease in the mechanical strength of the polysilicon membrane. In addition, due to poor reproducibility of each of the growth direction and grain sizes of the crystals, performance of the pressure sensor may be unstable.

SUMMARY

An object of the present disclosure is to provide a highly stable capacitive pressure sensor, and a manufacturing method for the same.

A pressure sensor according to one embodiment includes: a first electrode; a plurality of cavities; and a second electrode disposed opposite the first electrode through the plurality of cavities and including a flat structure spanning two adjacent cavities of the plurality of cavities.

A pressure sensor manufactured by a manufacturing method according to one embodiment includes: a first electrode; a cavity; and a second electrode disposed opposite the first electrode through the cavity. The manufacturing method of one embodiment includes: forming the first electrode; forming a sacrificial layer over the first electrode; forming the second electrode over the sacrificial layer; forming a vent hole in the second electrode, to expose a top surface of the sacrificial layer; and forming the cavity by etching the sacrificial layer with etchant and expelling an etched material from the vent hole. The sacrificial layer includes a first layer, and a second layer disposed between the first electrode and the first layer and having a higher etching rate than the first layer.

According to an example pressure sensor and example manufacturing method for making a pressure sensor, the flat structure can improve mechanical strength of the second electrode by suppressing the above-described decrease in mechanical strength of the second electrode typical of previous approaches. As a result, example approaches herein may provide a pressure sensor capable of performing with relatively higher stability.

Other and further objects, features, and advantages of the present disclosure will appear more fully from the following description.

DETAILED DESCRIPTION

In the following, some embodiments and modification examples of the present disclosure are described in detail with reference to the accompanying drawings. It should be understood that the following description covers exemplary embodiments and is not intended to limit the scope of the present disclosure. Terms indicating ordinal number, position, orientation, direction and vertical relationship are used for convenience only and are also not intended to limit the present disclosure.

Figure 1:
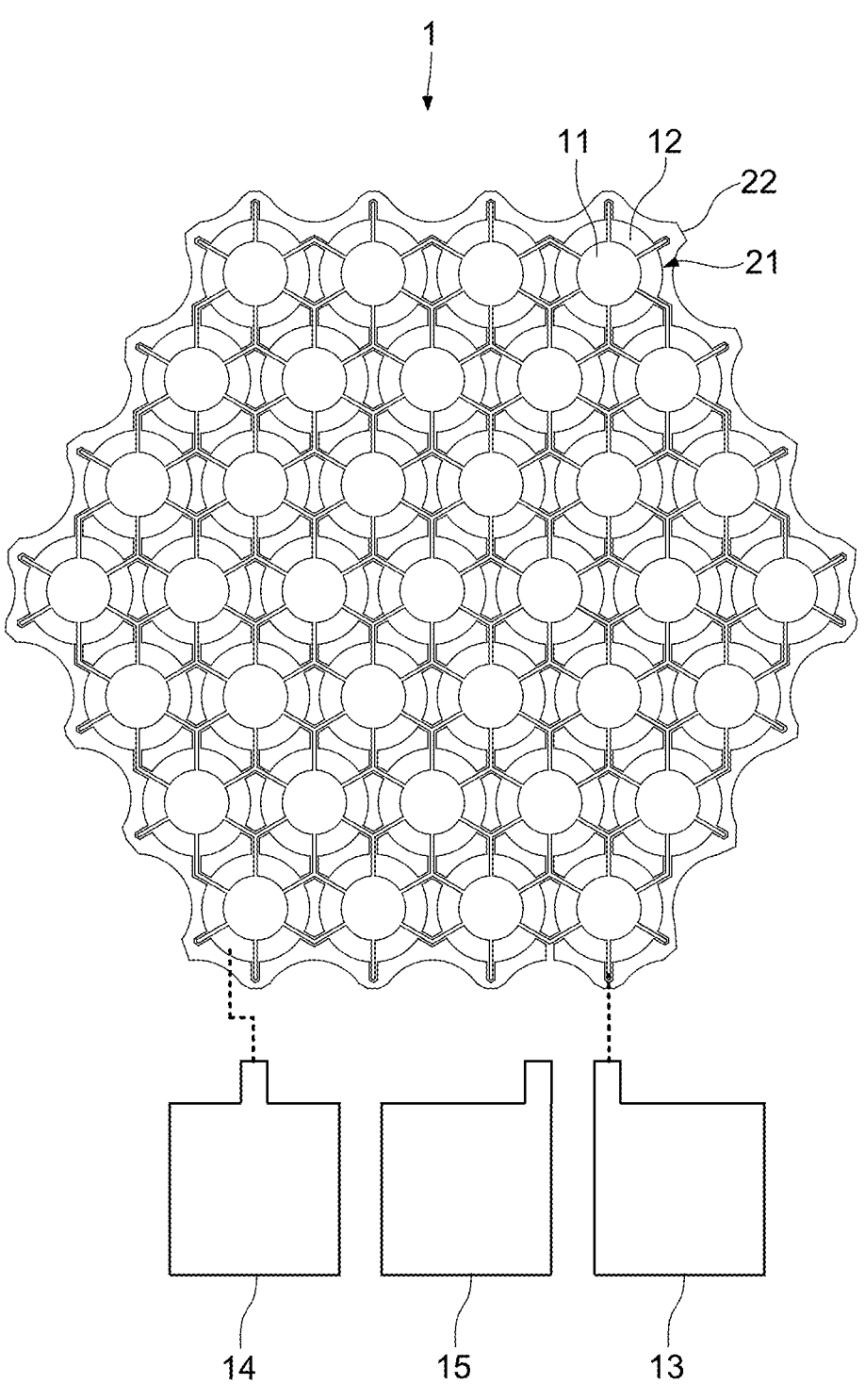
FIG. 1 is a plan view showing a pressure sensor according to a first embodiment.
Figure 2:
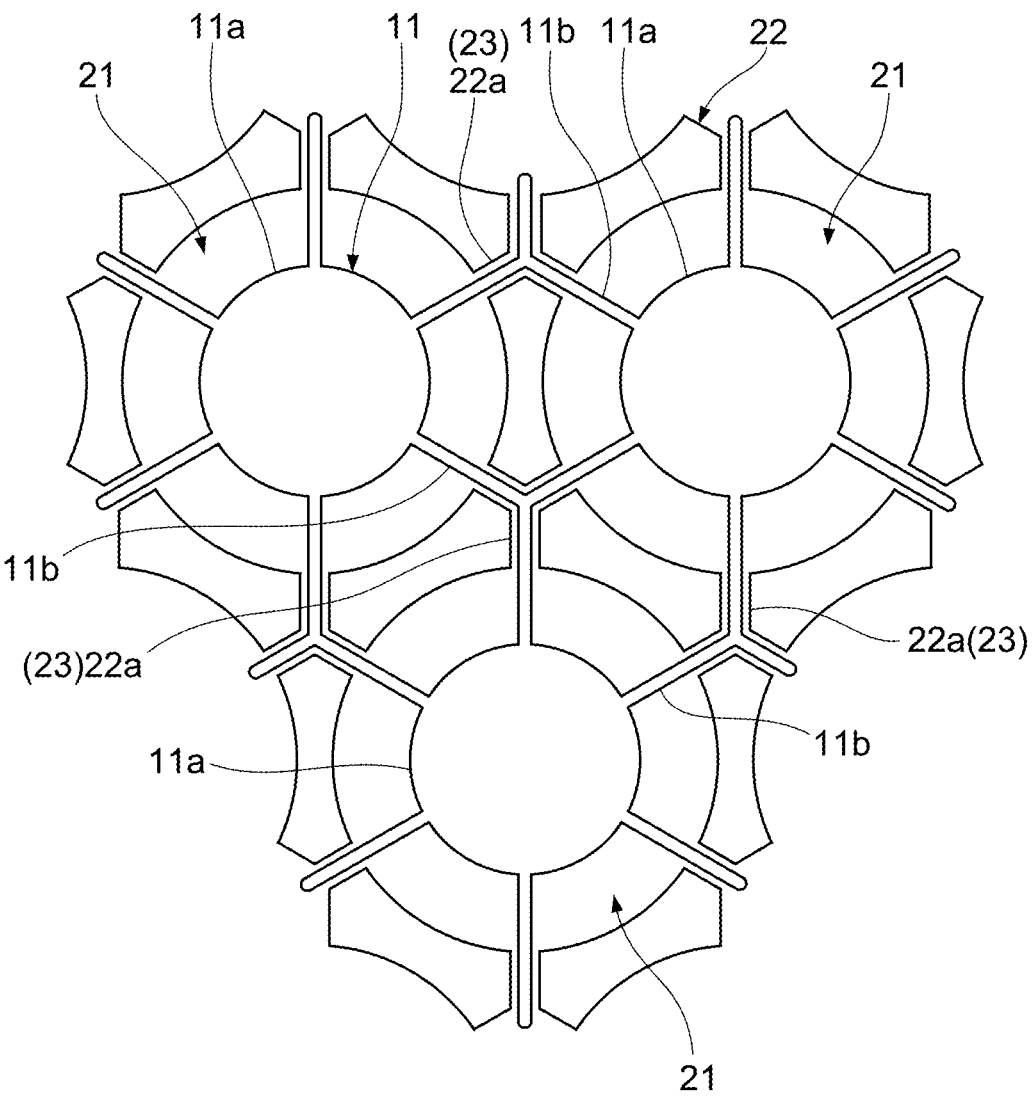
FIG. 2 is an enlarged plan view of a part of the pressure sensor shown in FIG. 1.
Figure 3:
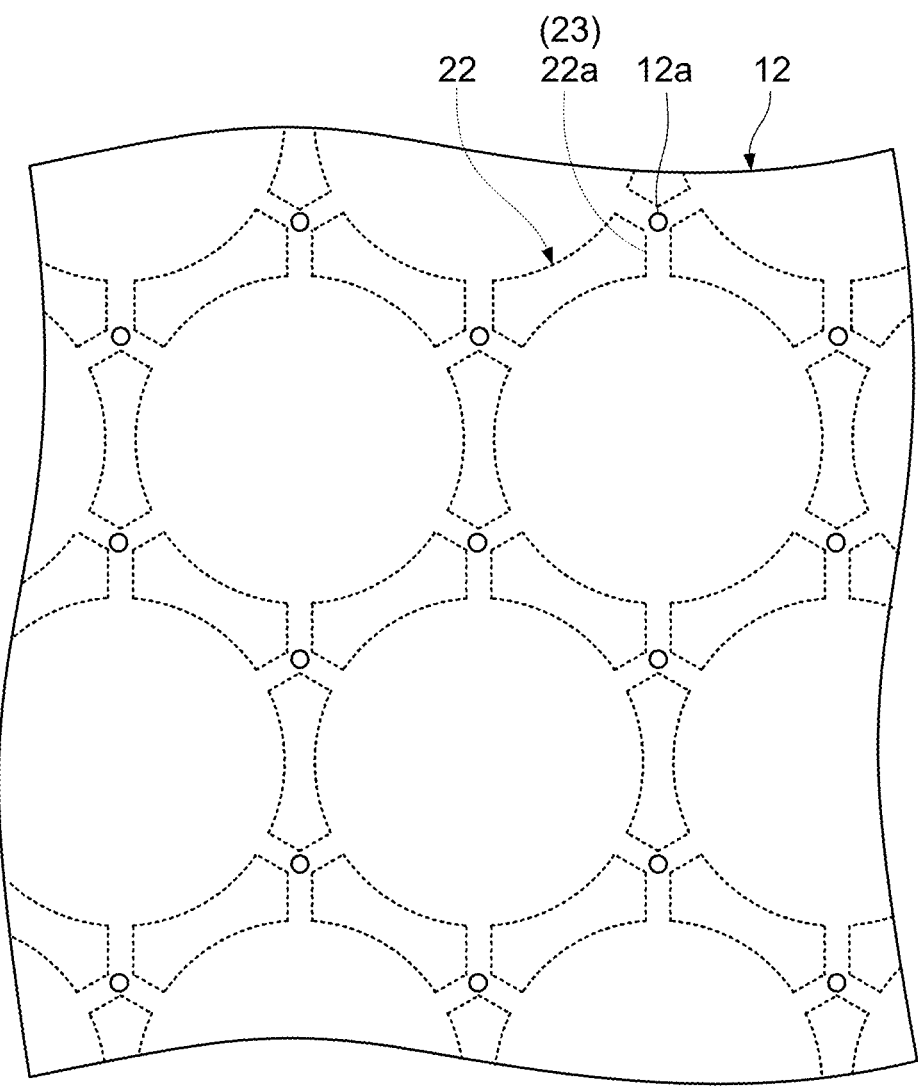
FIG. 3 is a plan view showing a second electrode of an embodiment of the present disclosure.
Figure 4:
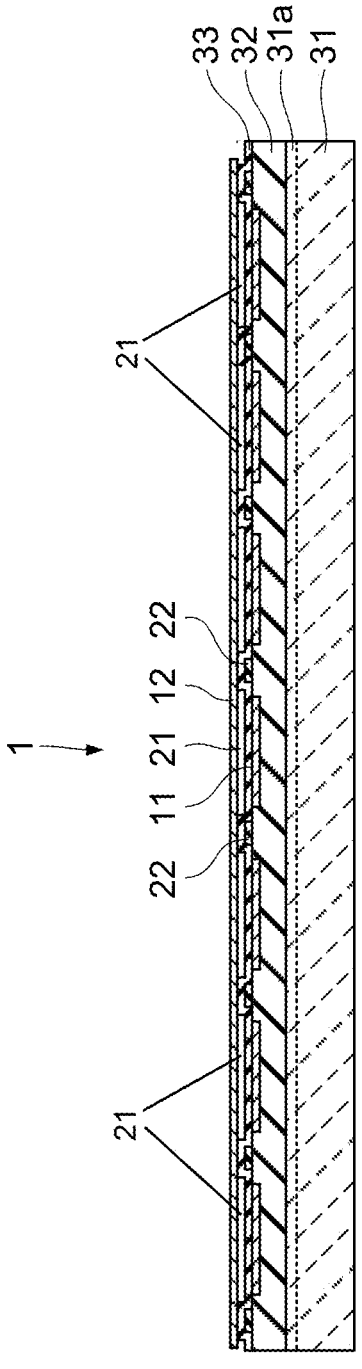
FIG. 4 is a cross-sectional view showing a part of the pressure sensor according to the first embodiment.
Figure 5:
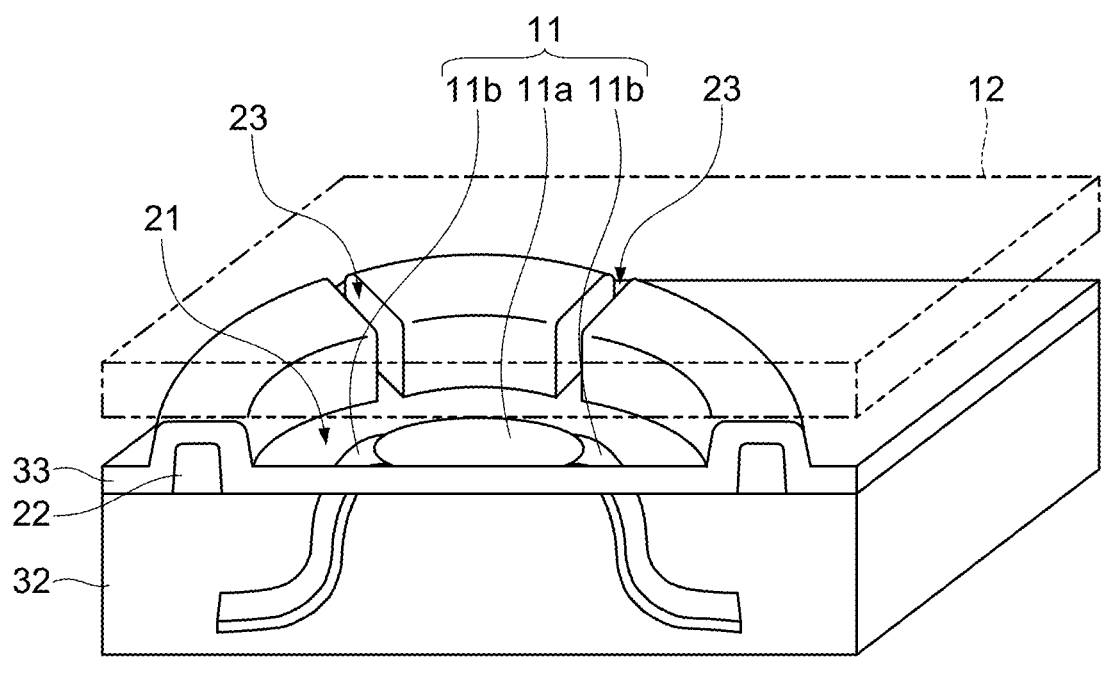
FIG. 5 is a perspective view showing a part of the pressure sensor according to an embodiment of the present disclosure.
Figure 6:
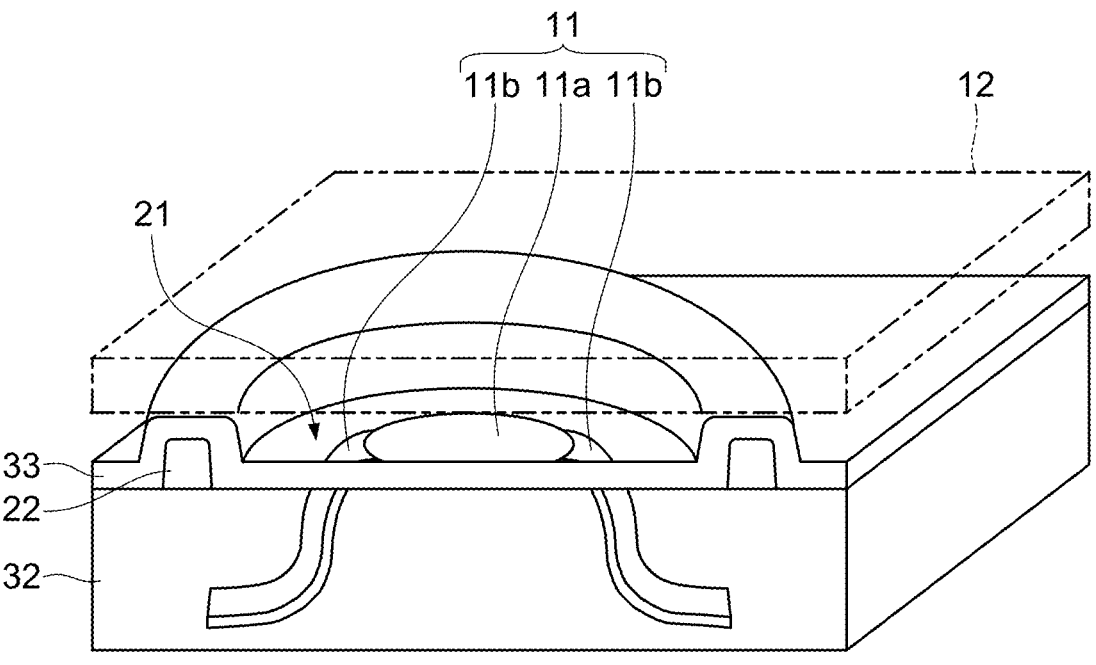
FIG. 6 is a perspective view showing a part of the pressure sensor according to an embodiment of the present disclosure.

First, reference is made to FIGS. 1 to 6 to describe a configuration of a pressure sensor of a first embodiment. FIG. 1 is a plan view showing the pressure sensor according to the present embodiment. FIG. 2 is an enlarged plan view of a part of the pressure sensor shown in FIG. 1. FIG. 3 is a plan view showing a second electrode of the present embodiment. FIG. 4 is a cross-sectional view showing a part of the pressure sensor according to the present embodiment. Each of FIGS. 5 and 6 is a perspective view showing a part of the pressure sensor according to the present embodiment.

The pressure sensor 1 according to the present embodiment is a capacitive pressure sensor. The pressure sensor 1 includes a first electrode 11, a second electrode 12 disposed at a predetermined distance from the first electrode 11, a pad 13 electrically connected to the first electrode 11, and a pad 14 electrically connected to the second electrode 12. FIG. 1 shows the pressure sensor 1 when it is looking at the pressure sensor 1 in the direction from the first electrode 11 to the second electrode 12. In FIG. 1, a reference numeral 15 indicates a pad connected to the ground.

The pressure sensor 1 is a MEMS device configured so that the capacitance between the first electrode 11 and the second electrode 12 changes in response to the pressure to be detected. In the present embodiment, in particular, the position of the second electrode 12 changes partially in response to the pressure to be detected. This causes the capacitance between the first electrode 11 and the second electrode 12 to change. The pressure to be detected is detected by detecting the capacitance converted into a voltage by a not-shown detection circuit connected to the pressure sensor 1.

Each of the first and second electrodes 11 and 12 may comprise a polysilicon membrane. The polysilicon membrane is doped with impurities to provide conductivity. The polysilicon membrane may be an N-type semiconductor with a high impurity concentration. In this case, phosphorus (P) is used as impurity, for example.

The pressure sensor 1 further includes a plurality of cavities 21, a spacer 22 disposed between the first electrode 11 and the second electrode 12, and a plurality of slits 23 connecting two or three adjacent cavities 21, respectively. The spacer 22 divides the space between the first electrode 11 and the second electrode 12 into the plurality of cavities 21. FIG. 5 shows one cavity 21 disposed in a center of the pressure sensor 1. FIG. 6 shows one other cavity 21 located at an outer edge of the pressure sensor 1. FIG. 6 shows, in particular, the other one cavity 21 as viewed from the center of the pressure sensor 1 toward the outer edge.

Here, a direction in which the first electrode 11 and the second electrode 12 are stacked is referred to as the stacking direction. In the following description, the expression "when viewed from above" means viewing an object from a distance in one direction parallel to the stacking direction. The plurality of cavities 21 are arranged in two directions, each orthogonal to the stacking direction, when viewed from above.

The second electrode 12 faces the first electrode 11 through the plurality of cavities 21. As shown in FIG. 4, the second electrode 12 includes a flat structure spanning two adjacent cavities of the plurality of cavities 21. The flat structure will be described in more detail later.

The spacer 22 is formed of an insulating material. For example, silicon nitride, silicon oxide (e.g., SiO₂), or aluminum oxide is used as the insulating material constituting the spacer 22.

The first electrode 11 includes a plurality of sensitive portions 11a and a plurality of connection portions 11b. Accordingly, the plurality of sensitive portions 11a may be a firs portion of the first electrode 11, while the plurality of connection portions 11b are a second portion of the first electrode 11. A planar shape (shape viewed from above) of each of the plurality of sensitive portions 11a may be circular or polygonal, merely as examples. In the examples shown in FIGS. 1 and 2, the planar shape of each of the plurality of sensitive portions 11a is circular. The planar shape of each of the plurality of sensitive portions 11a is smaller than a planar shape of each of the plurality of cavities 21.

Each of the plurality of sensitive portions 11a is disposed to overlap each of the plurality of cavities 21 when viewed from above. Here, focusing on a pair of one sensitive portion 11a and one cavity 21, a center of the one sensitive portion 11a may be in the same or nearly the same position as a center of the cavity 21 when viewed from above.

Each of the plurality of connection portions 11b connects two or three sensitive portions 11a that are adjacent to each other. In FIG. 4, the plurality of connection portions 11b are omitted.

As shown in FIGS. 5 and 6, the sensitive portion 11a is disposed closer to the second electrode 12 than the plurality of connection portions 11b (excluding the portions connected to the sensitive portions 11a). As noted above, in at least some example approaches the plurality of connection portions 11b (excluding the portions connected to the sensitive portions 11a) are a "first portion of the first electrode" while the sensitive portion 11a is a "second portion of the first electrode.".

The spacer 22 has a plurality of slits 22a corresponding to the plurality of slits 23, respectively. As described below, the spacer 22 is covered with an insulating film. A width of each of the plurality of slits 23 is smaller than a width of each of the plurality of slits 22a by the insulating film. In the examples shown in FIGS. 1 and 2, the plurality of connection portions 11b are disposed to overlap the plurality of slits 23 when viewed from above. However, in other approaches it is possible for the plurality of connection portions 11b to not overlap the plurality of slits 23 when viewed from above.

The second electrode 12 has a plurality of vent holes 12a. In the examples shown in FIGS. 1 and 2, the plurality of vent holes 12a are disposed to overlap the plurality of slits 23 when viewed from above. However, the plurality of vent holes 12a may not overlap the plurality of cavities 21 when viewed from above.

As shown in FIG. 4, the pressure sensor 1 further includes a substrate 31 and insulating films 32 and 33. The insulating film 32 is disposed on the substrate 31. The first electrode 11 is embedded in the insulating film 32. A top surface of the first electrode 11 and a top surface of the insulating film 32 are planarized. The spacer 22 is disposed on the insulating film 32. The insulating film 33 covers the first electrode 11 and the spacer 22. The second electrode 12 is disposed over the spacer 22 so that the insulating film 33 is disposed between the second electrode 12 and the spacer 22.

The substrate 31 may be an N-type silicon substrate, merely by way of example. In FIG. 4, the area marked with a reference numeral 31a indicates a region of the substrate 31 where the impurity diffusion layer with high impurity concentration is formed.

The insulating film 32 is formed, for example, by silicon oxide. In particular, at least a portion of the insulating film 32 may be formed by silicon oxide using tetraethoxysilane (TEOS) as a raw material. The insulating film 33 is formed, for example, by silicon nitride.

Figure 22:
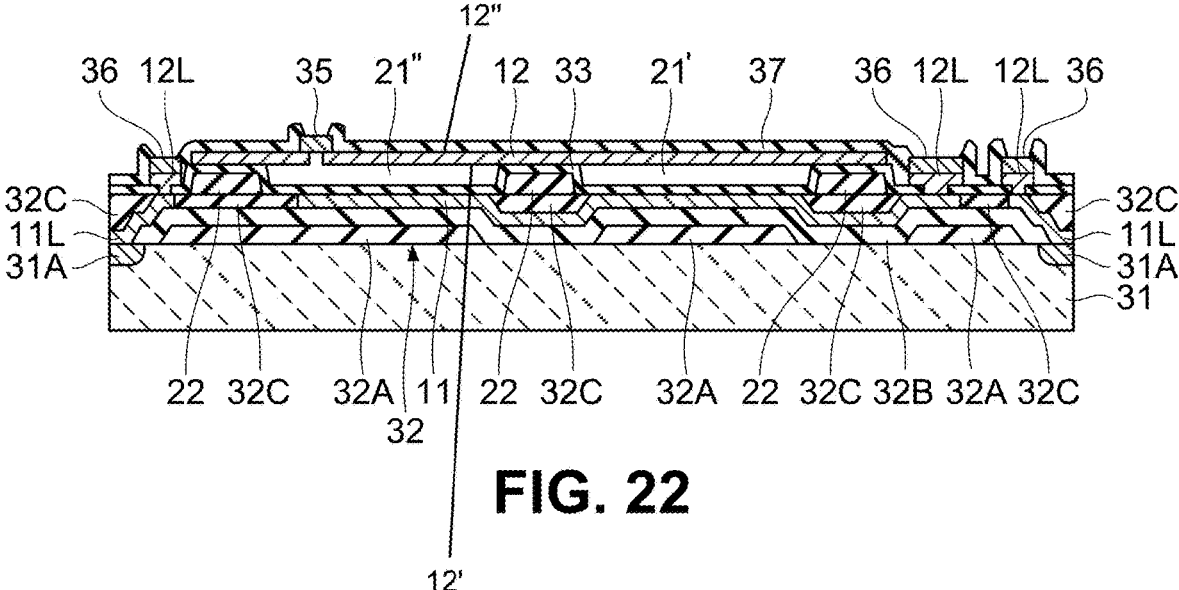
FIG. 22 is a schematic cross-sectional view showing a step of a manufacturing method for the pressure sensor according to an embodiment of the present disclosure.

As described above, the second electrode 12 includes the flat structure. The flat structure of the second electrode 12 may be parallel to a top surface of the substrate 31 when no pressure is applied to the second electrode 12. The entirety of the second electrode 12 may have the flat structure, or most of the second electrode 12 may have the flat structure. If most of the second electrode 12 has the flat structure, the second electrode 12 may further include a portion closer to the first electrode 11 than the flat structure. In at least some example approaches, the flat structure of the second electrode 12 may be characterized by continuous upper and lower surfaces, with each extending across an entirety of at least one of the cavities 21, and at least a portion of an adjacent cavity 21. For example, as shown in FIG. 22, second electrode 12 defines a lower surface 12' extending across an entirety of cavity 21', and a portion of cavity 21". Similarly, second electrode 12 defines an upper surface 12" extending across the entirety of cavity 21', and a portion of cavity 21".

Each of the plurality of cavities 21 is surrounded by the second electrode 12 and the insulating film 33. When the second electrode 12 is formed by a polysilicon membrane and the insulating film 33 is formed by silicon nitride, each of the plurality of cavities 21 can be said to be surrounded by a polysilicon membrane and a silicon nitride film.

Next, a manufacturing method, e.g., for the pressure sensor 1, is described in further detail according to the an example approach, with reference to FIGS. 7 to 22. FIGS. 7 to 22 illustrate a simplified model of a cross-section of a stack of the pressure sensor 1 in the manufacturing process to describe the manufacturing method. FIGS. 7 to 22 are not illustrated with the intention of limiting the number and positioning of the multiple components of the pressure sensor 1, and other example approaches will be apparent from the following description.

Figure 7:
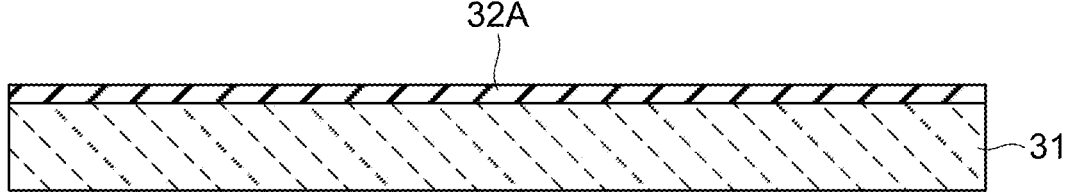
FIG. 7 is a schematic cross-sectional view showing a step of a manufacturing method for the pressure sensor according to an embodiment of the present disclosure.

In an example manufacturing method for the pressure sensor 1, first, a surface of the substrate 31 is oxidized to form a first layer 32A of the insulating film 32, as shown in FIG. 7. A thickness of the first layer 32A is, for example, 1.0 μm.

Figure 8:
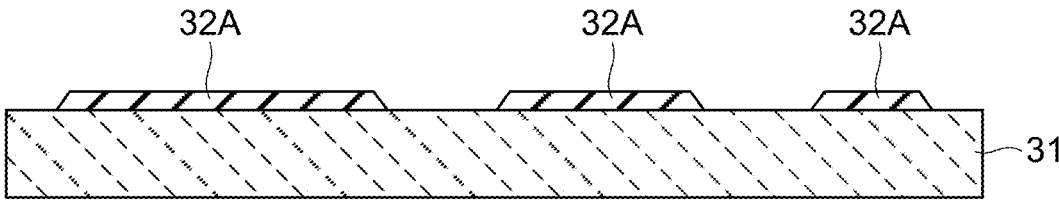
FIG. 8 is a schematic cross-sectional view showing a step of a manufacturing method for the pressure sensor according to an embodiment of the present disclosure.

FIG. 8 shows a step that may follow that illustrated in FIG. 7. In this step, the first layer 32A is selectively etched by, for example, reactive ion etching (hereinafter, referred to as RIE) with a photoresist mask patterned by photolithography.

Figure 9:
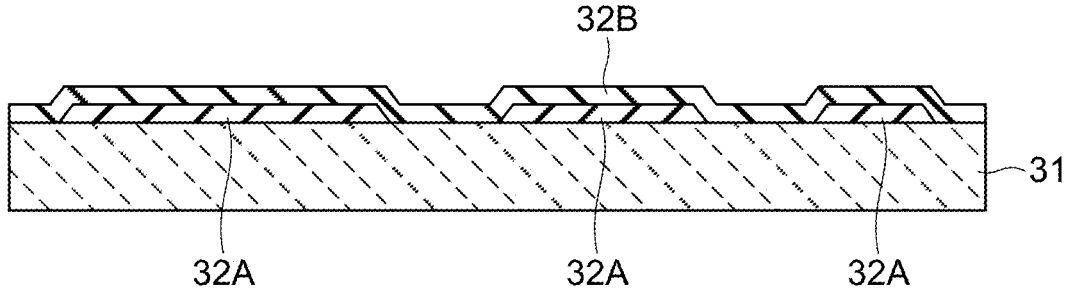
FIG. 9 is a schematic cross-sectional view showing a step of a manufacturing method for the pressure sensor according to an embodiment of the present disclosure.

FIG. 9 shows a step that may follow that illustrated in FIG. 8. In this step, a second layer 32B of insulating film 32 is formed on the stack. The thickness of the second layer 32B is, for example, 1.0 The second layer 32B may be formed by silicon oxide using TEOS as a raw material. In this case, the second layer 32B is formed by, for example, chemical vapor deposition (hereinafter, referred to as CVD).

Figure 10:
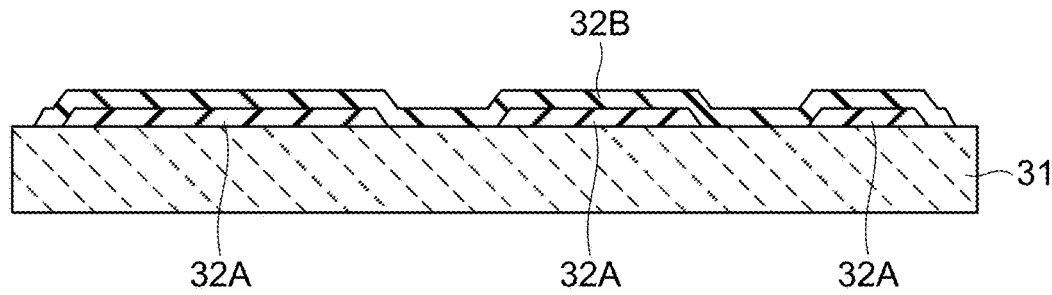
FIG. 10 is a schematic cross-sectional view showing a step of a manufacturing method for the pressure sensor according to an embodiment of the present disclosure.

FIG. 10 shows a step that may follow that illustrated in FIG. 9. In this step, the second layer 32B is selectively etched by, for example, RIE with a photoresist mask patterned by photolithography to form, in the second layer 32B, a plurality of openings each expose a top surface of the substrate 31.

Figure 11:
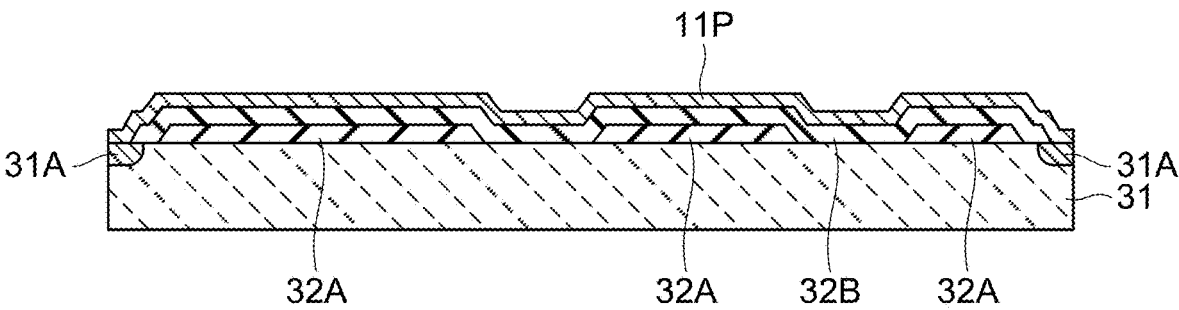
FIG. 11 is a schematic cross-sectional view showing a step of a manufacturing method for the pressure sensor according to an embodiment of the present disclosure.

FIG. 11 shows a step that may follow that illustrated in FIG. 10. In this step, first, a material constituting the first electrode 11 is formed on the substrate 31 and the second layer 32B. Here, the case in which the first electrode 11 is formed by a polysilicon membrane 11P will be described as an example. The polysilicon membrane 11P is formed on the substrate 31 and the second layer 32B. The polysilicon membrane 11P contacts the top surface of the substrate 31 through the plurality of openings of the second layer 32B. A thickness of the polysilicon membrane 11P is in the range of 300 nm to 400 nm, for example.

Next, impurities may be diffused into the polysilicon membrane 11P. Diffusion of impurities into the polysilicon membrane 11P may be performed using $POCl_3$. As a result, the polysilicon membrane 11P is doped with phosphorus (P), making the polysilicon membrane 11P an N-type (N+) semiconductor with a high impurity concentration. Next, the stack may be annealed to form impurity diffusion layers 31A with high impurity concentration in the substrate 31. A temperature of the annealing is in the range of 1000° C. to 1100° C., for example. When the polysilicon membrane 11P is the N-type semiconductor with a high impurity concentration, the impurity diffusion layers 31A become an N-type (N+) diffusion layer with a high impurity concentration.

Figure 12:
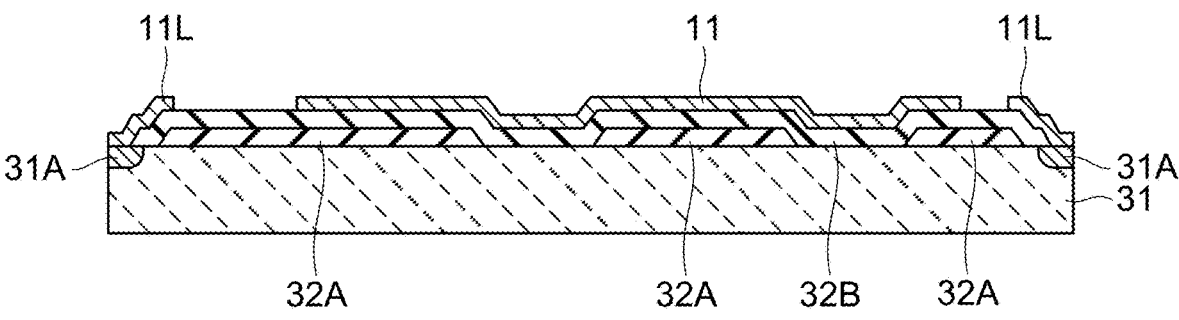
FIG. 12 is a schematic cross-sectional view showing a step of a manufacturing method for the pressure sensor according to an embodiment of the present disclosure.

FIG. 12 shows a step that may follow that illustrated in FIG. 11. In this step, the polysilicon membrane 11P is selectively etched by, for example, RIE with a photoresist mask patterned by photolithography so that the polysilicon membrane 11P becomes the first electrode 11. Portions of the polysilicon membrane 11P after the etching, which are in contact with the impurity diffusion layers 31A, become line layers 11L.

Figure 13:
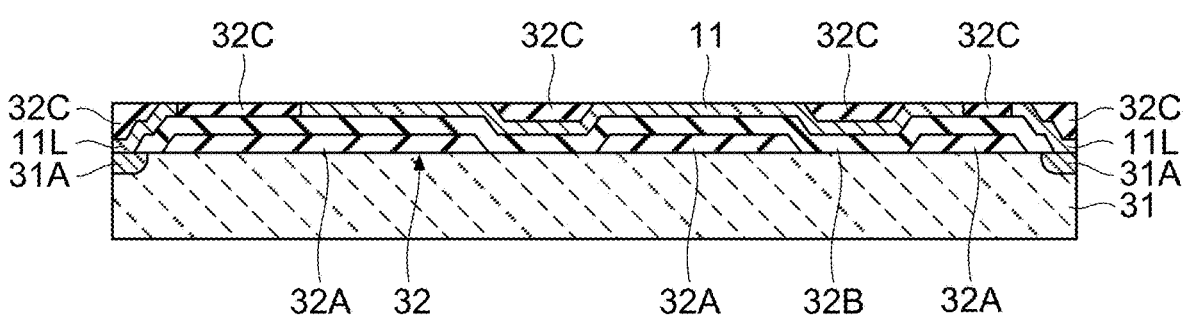
FIG. 13 is a schematic cross-sectional view showing a step of a manufacturing method for the pressure sensor according to an embodiment of the present disclosure.

FIG. 13 shows a step that may follow that illustrated in FIG. 12. In this step, first, a third layer 32C of the insulating film 32 is formed on the stack. The third layer 32C is formed by silicon oxide using TEOS as the raw material, for example. Next, the stack is annealed. A temperature of the annealing is in the range of 1000° C. to 1100° C., for example. Next, a top surface of the stack is planarized by chemical mechanical polishing (hereinafter, referred to as CMP), for example. Planarization of the top surface of the stack may be performed until the first electrode 11 is exposed.

Figure 14:
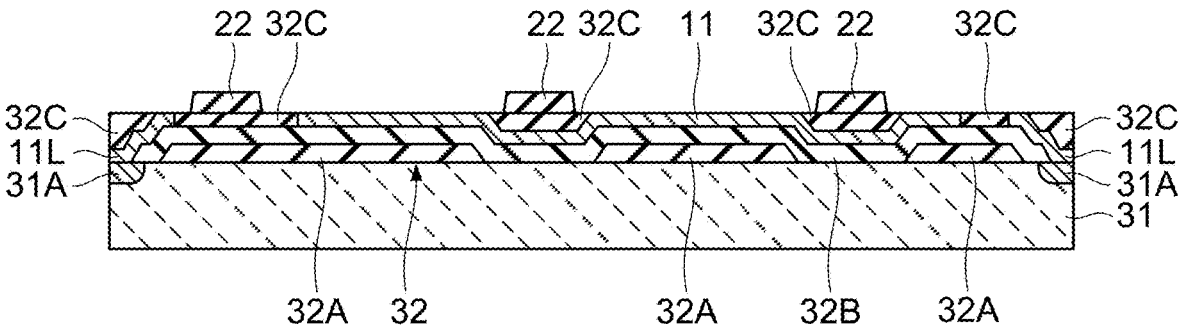
FIG. 14 is a schematic cross-sectional view showing a step of a manufacturing method for the pressure sensor according to an embodiment of the present disclosure.

FIG. 14 shows a step that may follow that illustrated in FIG. 13. In this step, first, an insulating film 22P, which will later become the spacer 22, is formed on the stack. The insulating film 22P is formed using CVD, for example. A thickness of the insulating film 22P is in the range of 200 nm to 300 nm, for example. Next, the insulating film 22P is selectively etched by, for example, RIE with a photoresist mask patterned by photolithography so that the insulating film 22P becomes the spacer 22.

When the insulating film 22P, i.e., the spacer 22, is formed by silicon oxide, the spacer 22 may be annealed after the insulating film 22P is etched. When the third layer 32C of the insulating film 32 is formed by silicon oxide, an etching rate of the insulating film 22P (silicon oxide) before annealing is greater than that of the third layer 32C (silicon oxide) after annealing in the step shown in FIG. 13. Therefore, insulating film 22P can be etched selectively.

When the insulating film 22P, i.e., the spacer 22, is formed by aluminum oxide or silicon nitride, the insulating film 22P may be annealed before etching, or the spacer 22 may be annealed after etching the insulating film 22P. When the third layer 32C is formed by silicon oxide, the RIE conditions under which the insulating film 22P (aluminum oxide or silicon nitride) can be selectively etched can be selected.

Figure 15:
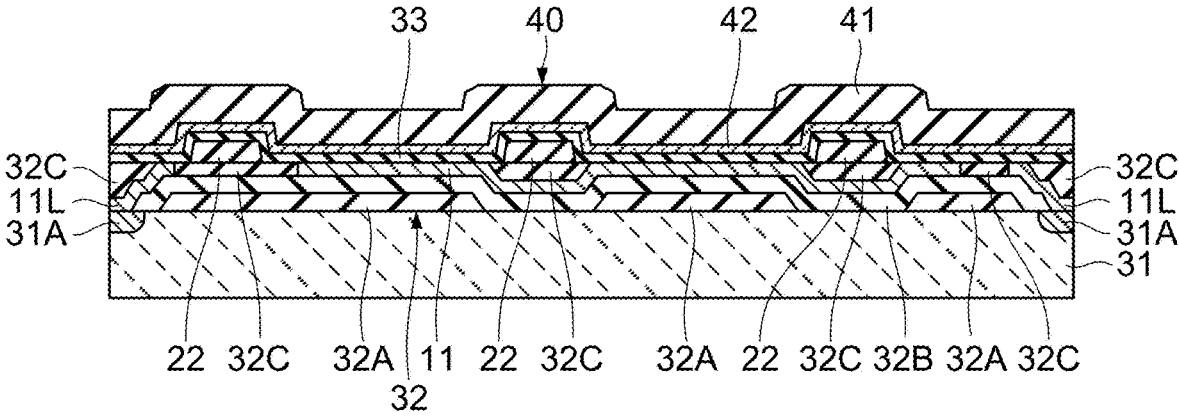
FIG. 15 is a schematic cross-sectional view showing a step of a manufacturing method for the pressure sensor according to an embodiment of the present disclosure.

FIG. 15 shows a step that may follow that illustrated in FIG. 14. In this step, first, an insulating film 33 is formed on the stack. A thickness of the insulating film 33 is in the range of 100 nm to 200 nm, for example. Next, a sacrificial layer 40 is formed on the insulating film 33. Since the insulating film 33 is formed on the first electrode 11, the sacrificial layer 40 is formed over the first electrode 11.

The sacrificial layer 40 includes a first layer 41 and a second layer 42 disposed between the first electrode 11 and the first layer 41. Forming the sacrificial layer 40 includes forming the second layer 42 on the insulating film 33 and forming the first layer 41 on the second layer 42. The first layer 41 is formed so that the top surface thereof is disposed above a portion of the second layer 42 that is disposed on the spacer 22. A thickness of the second layer 42 is in the range of 50 nm to 150 nm, for example. A thickness of the first layer 41 is in the range of 500 nm to 600 nm, for example. Next, the stack is annealed. A temperature of the annealing is in the range of 1000° C. to 1100° C., for example.

The second layer 42 is formed of a material that has a higher etching rate than that of the first layer 41. For example, when the first layer 41 is formed of silicon oxide, the second layer 42 may be formed of phosphorus silicate glass. In this case, the first layer 41 may be formed by CVD, for example.

Figure 16:
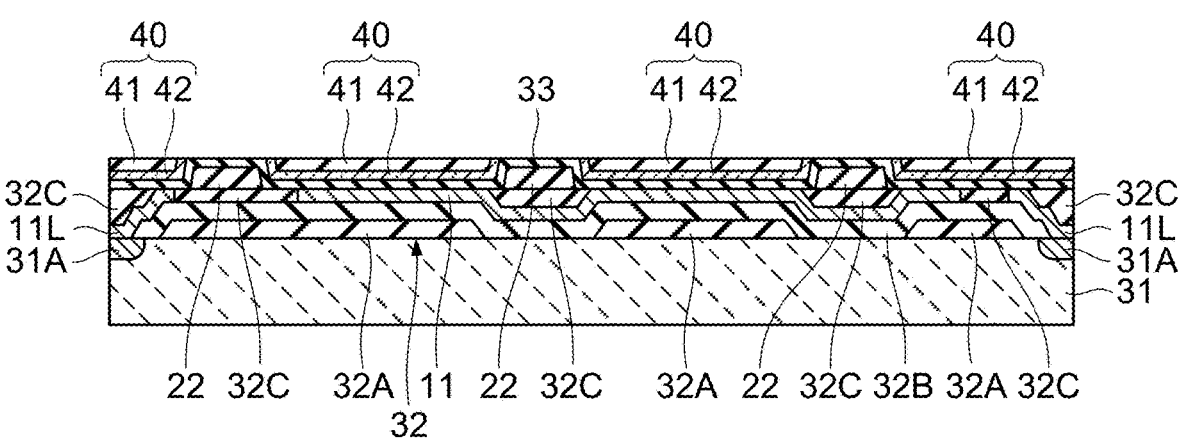
FIG. 16 is a schematic cross-sectional view showing a step of a manufacturing method for the pressure sensor according to an embodiment of the present disclosure.

FIG. 16 shows a step that may follow that illustrated in FIG. 15. In this step, a top surface of the stack is planarized by CMP, for example. Planarization of the top surface of the stack may be performed until the insulating film 33 is exposed. When the insulating film 33 is formed by silicon nitride, the insulating film 33 functions as a polishing stopper for stopping the polishing. By causing the insulating film 33 to function as a polishing stopper, the thickness of the sacrificial layer 40 can be accurately controlled and the dishing caused by the difference in polishing rates between the first layer 41 and the second layer 42 can be suppressed.

Figure 17:
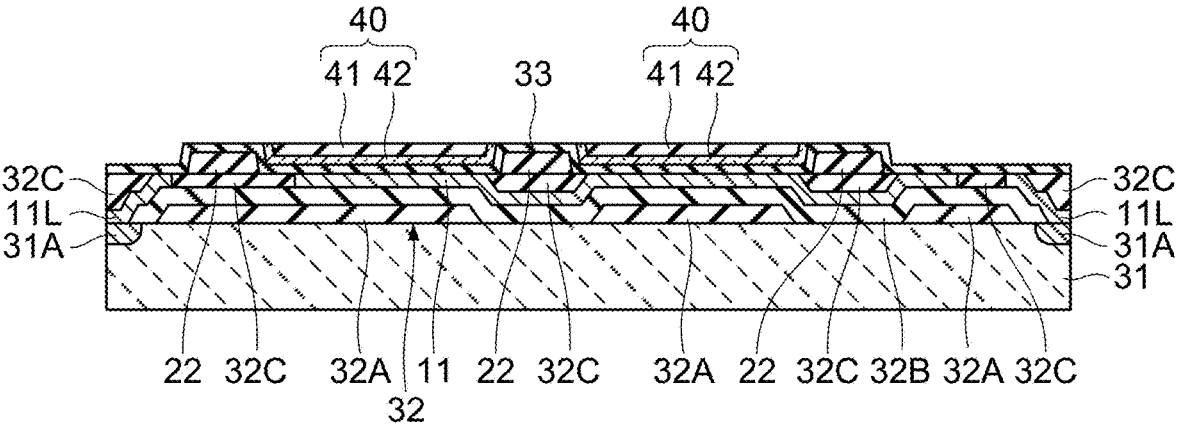
FIG. 17 is a schematic cross-sectional view showing a step of a manufacturing method for the pressure sensor according to an embodiment of the present disclosure.

FIG. 17 shows a step that may follow that illustrated in FIG. 16. In this step, first, the first layer 41 is etched by, for example, RIE with a photoresist mask patterned by photolithography to remove portions of the first layer 41 that are located in areas other than the area where the plurality of cavities 21 will later be formed. Etching of the first layer 41 may be stopped when a material constituting the second layer 42 is detected. Now, focus is placed on a portion of the first layer 41 disposed in an area where one cavity 21 is to be formed. An outer edge of the portion, in its entirety, is adjacent to the spacer 22. Next, a portion of the second layer 42 that is not covered by the first layer 41 is removed by wet etching, for example. When the second layer 42 is formed by phosphorus silicate glass, an etchant made of hydrofluoric acid (HF) diluted by pure water may be used. This allows the sacrificial layer 40 to be formed selectively and precisely without damaging the insulating film 33.

Figure 18:
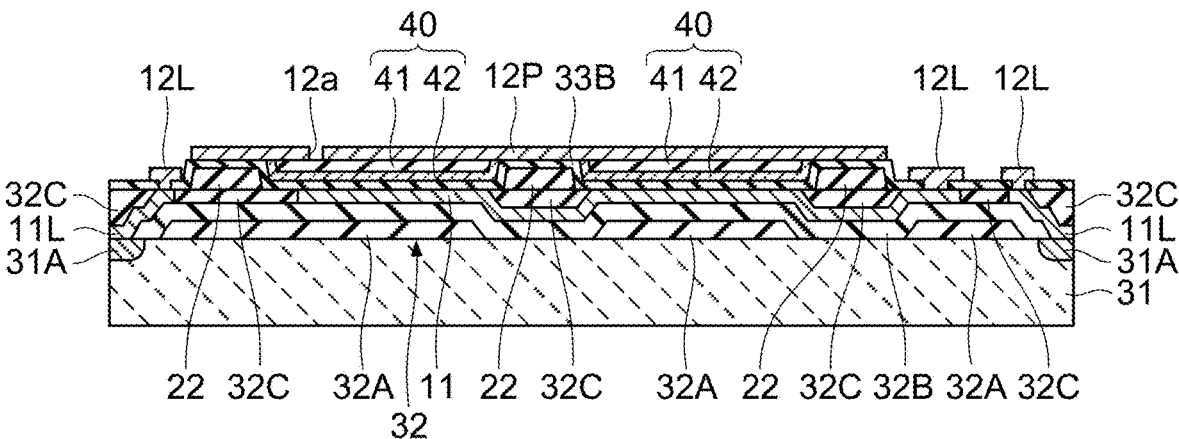
FIG. 18 is a schematic cross-sectional view showing a step of a manufacturing method for the pressure sensor according to an embodiment of the present disclosure.

FIG. 18 shows a step that may follow that illustrated in FIG. 17. In this step, first, the insulating film 33B is selectively etched by, for example, RIE with a photoresist mask patterned by photolithography to form a first opening to expose the top surface of the first electrode 11 and a plurality of second openings to expose top surfaces of the line layers 11L.

Next, a material constituting the second electrode 12 may be formed on the stack. Here, the case in which the second electrode 12 is formed by a polysilicon membrane 12P will be described as an example. The polysilicon membrane 12P is illustrated in FIG. 18 formed on the first electrode 11, the insulating film 33, and the sacrificial layer 40. A portion of the polysilicon membrane 12P that later becomes the second electrode 12 is formed on a flat top surface of the structure constituted of the spacer 22, the insulating film 33, and the sacrificial layer 40. As shown in FIG. 18, the polysilicon membrane 12P contacts the top surface of the first electrode 11 through the first opening of the insulating film 33 and contacts the top surfaces of the line layers 11L through the plurality of second openings of the insulating film 33. A thickness of the polysilicon membrane 12P is in the range of 300 nm to 400 nm, for example.

Next, impurities may be diffused into the polysilicon membrane 12P. Diffusion of impurities into the polysilicon membrane 12P may be performed using $POCl_3$. As a result, the polysilicon membrane 12P is doped with phosphorus (P), making the polysilicon membrane 12P an N-type (N+) semiconductor with a high impurity concentration. Next, the stack is annealed. A temperature of the annealing is in the range of 1000° C. to 1100° C., for example. By annealing the stack, an internal stress of the polysilicon membrane 12P can be reduced.

Next, the polysilicon membrane 12P may be selectively etched by, for example, RIE with a photoresist mask patterned by photolithography so that the polysilicon membrane 12P becomes the second electrode 12, and a plurality of vent holes 12a are formed in the second electrode 12 to expose a top surface of the sacrificial layer 40. A diameter of each of the plurality of vent holes 12a is in the range of 0.4 μm to 0.6 μm, for example. A portion of the polysilicon membrane 12P after the etching, which is disposed on the insulating film 33 and the sacrificial layer 40, becomes the second electrode 12. Portions of the polysilicon membrane 12P after the etching, other than the second electrode 12, become line layers 12L.

Figure 19:
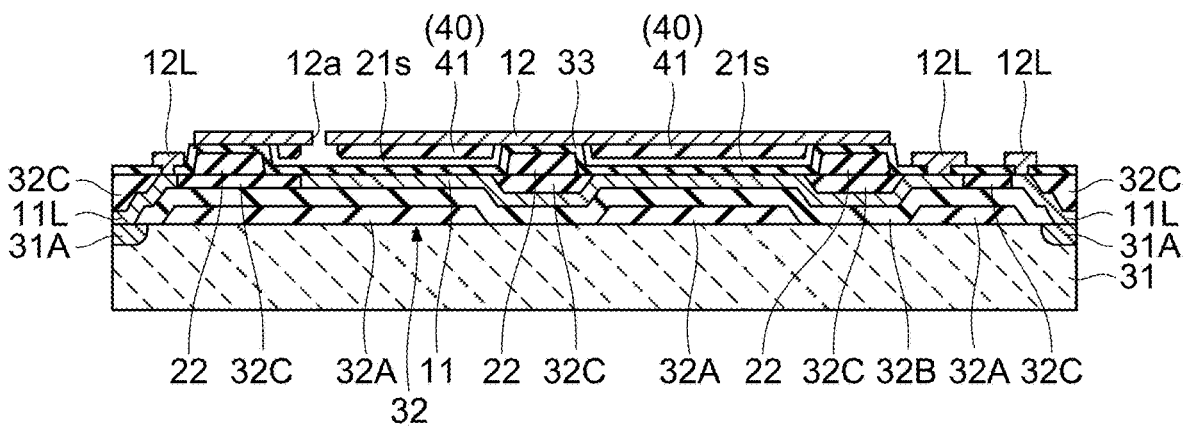
FIG. 19 is a schematic cross-sectional view showing a step of a manufacturing method for the pressure sensor according to an embodiment of the present disclosure.
Figure 20:
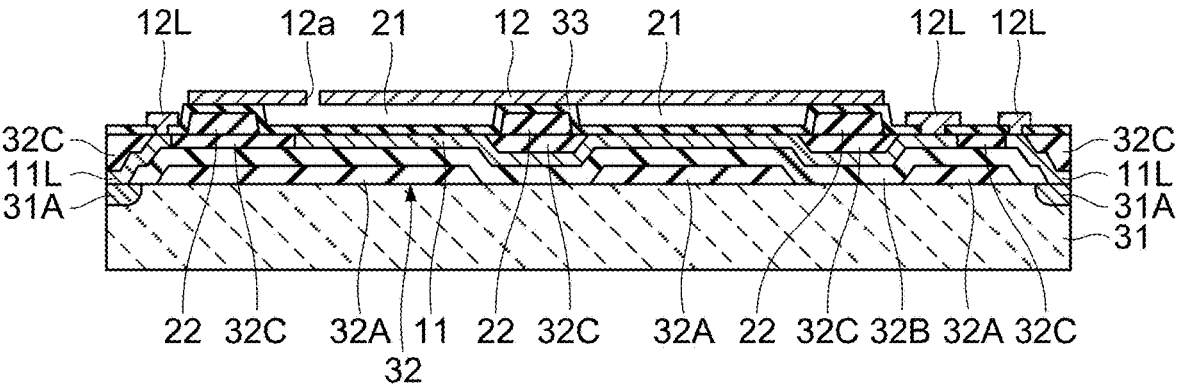
FIG. 20 is a schematic cross-sectional view showing a step of a manufacturing method for the pressure sensor according to an embodiment of the present disclosure.

FIGS. 19 and 20 show a step that may follow that illustrated in FIG. 18. In this step, the sacrificial layer 40 is etched and an etched material is expelled from the plurality of vent holes 12a to form the plurality of cavities 21. In the etching of the sacrificial layer 40, buffered oxide etch (BOE) or vapor hydrogen fluoride (vHF) is used as an etchant, for example.

As mentioned above, in at least some example approaches the etching rate of the second layer 42 is greater than that of the first layer 41. Therefore, in the etching of the sacrificial layer 40, the first layer 41 is etched after the second layer 42 is completely removed. FIG. 19 shows the stack after the second layer 42 has been completely removed. In the etching of the sacrificial layer 40, tunnel-like spaces 21s are formed between the insulating film 33 and the first layer 41 by the second layer 42 being completely removed. The first layer 41 is etched from the bottom surface (the surface facing the substrate 31) side of the first layer 41 to the top surface (the surface opposite the bottom surface) side of the first layer 41 by the etchant supplied from the tunnel-like spaces 21s. When the first layer 41 is formed by silicon oxide and the second layer 42 is formed by phosphorus silicate glass, the etching rate of the second layer 42 is, for example, in the range of 5 to 10 times the etching rate of the first layer 41.

The first layer 41 is completely removed to form the plurality of cavities 21. FIG. 20 shows the stack after the plurality of cavities 21 are formed.

Figure 21:
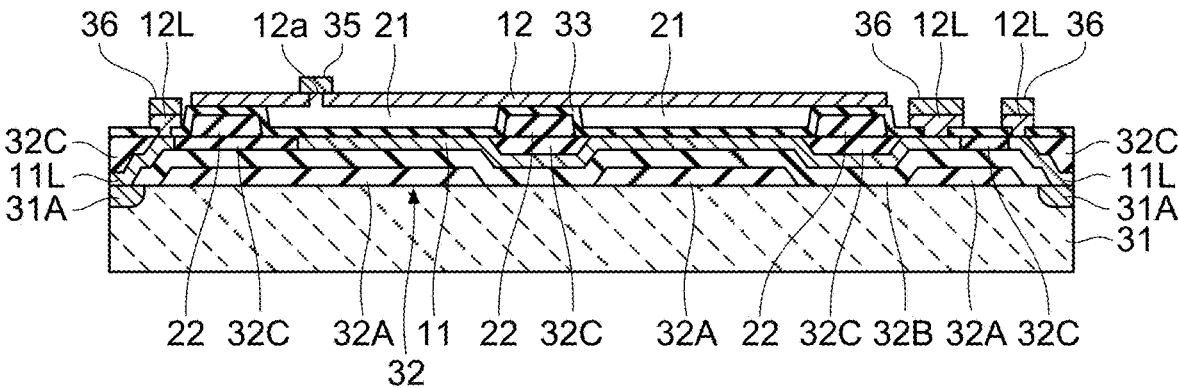
FIG. 21 is a schematic cross-sectional view showing a step of a manufacturing method for the pressure sensor according to an embodiment of the present disclosure.

FIG. 21 shows a step that may follow that illustrated in FIGS. 19 and 20. In this step, sealing layers 35 are formed to seal a plurality of vent holes 12a in a vacuum, and line layers 36 are formed on the line layers 121L. The sealing layers 35 and the line layers 36 each include at least one metal film formed by sputtering, for example. The sealing layers 35 and the line layers 36 may be, for example, laminate films of Al—Cu alloy and TiN, or laminate films of Ti, Al—Cu alloy and TiN.

FIG. 22 shows a step that may follow that illustrated in FIG. 21. In this step, first, a passivation film 37 is first formed on the stack. Next, by selectively etching the passivation film 37, openings may be formed in the passivation film 37 to respectively expose top surfaces of the sealing layers 35 and top surfaces of the line layers 36. This completes the pressure sensor 1.

The impurity diffusion layers 31A and the line layers 11L, 12L, and 36 may be used, for example, as part of the line that electrically connects the first electrode 11 to the pad 13 and/or as part of the line that electrically connects the second electrode 12 to the pad 14.

As described above, the manufacturing method for the pressure sensor 1 according to the example illustrations herein may generally include: forming the first electrode 11; forming the sacrificial layer 40 on the first electrode 11; forming the second electrode 12 on the sacrificial layer 40; forming the vent holes 12a in the second electrode 12 to expose the top surface of the sacrificial layer 40; and forming the cavities 21 by etching the sacrificial layer 40 and expelling the etched material from the vent holes 12a.

Continuing with this example, the sacrificial layer 40 may include the first layer 41 and the second layer 42 that is positioned between the first electrode 11 and the first layer 41 and has a higher etching rate than the first layer 41. As a result, according to the present example, the sacrificial layer 40 can be removed in a short time.

Continuing with this example, the portion of the polysilicon membrane 12P, which later becomes the second electrode 12, is formed on the flat top surface of the structure constituted of the spacer 22, the insulating film 33, and sacrificial layer 40. As a result, according to the present example, the flat structure that spans the two adjacent cavities 21 can be formed in the second electrode 12. In the present example illustration, in particular, the entire second electrode 12 may have the flat structure.

Continuing with this example, the impurity diffusion layers 31A with the high impurity concentration are formed by annealing the stack with the impurity-diffused polysilicon membrane 11P in contact with the top surface of the substrate 31. In other words, in the present example, the impurity diffusion layers 31A are formed using impurities doped in the polysilicon membrane 11P. As a result, according to the present example, ohmic contacts with low resistance can be formed between the impurity diffusion layers 31A and the line layers 11L.

In the present example, the stack is annealed with the impurity-diffused polysilicon membrane 11P in contact with the top surface of each of the first electrode 11 and the line layers 12L. As a result, according to the present example, ohmic contacts with low resistance can be formed between the first electrode 11 and the second electrode 12 and between the line layers 11L and the line layers 12L.

Figure 23:
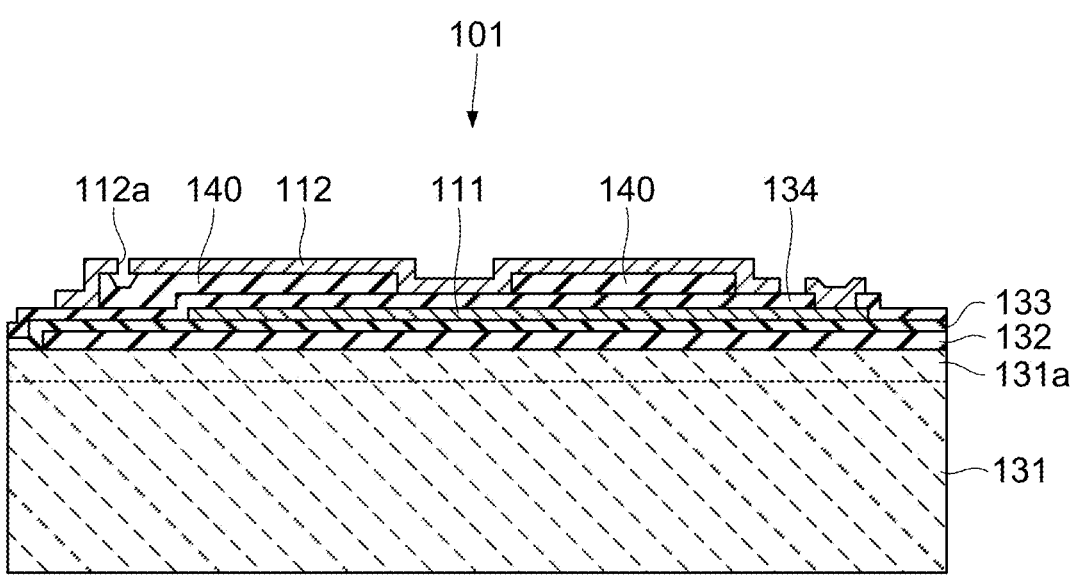
FIG. 23 is a schematic cross-sectional view showing a step of a manufacturing method for a pressure sensor of a comparative example.
Figure 24:
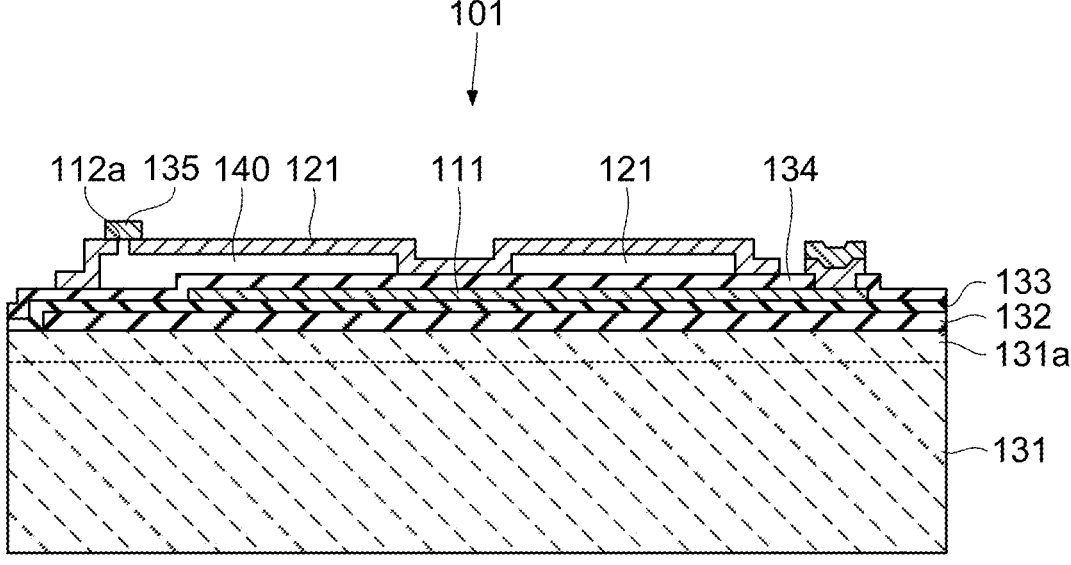
FIG. 24 is a schematic cross-sectional view showing a step of a manufacturing method for a pressure sensor of a comparative example.

Next, the effects of the present example will be explained in more detail by comparing it with a manufacturing method for a pressure sensor 101 of a comparative example, e.g., as illustrated in FIGS. 23 and 24 and described below. First, a brief description of the configuration of the pressure sensor 101 of the comparative example will be given. Similar to the pressure sensor 1 according to the present embodiment, the pressure sensor 101 of the comparative example includes a first electrode 111, a plurality of cavities 121, and a second electrode 112 arranged to face the first electrode 111 through the plurality of cavities 121. Each of the first and second electrodes 111 and 112 is formed by a polysilicon membrane. The pressure sensor 101 of the comparative example differs from the pressure sensor 1 according to the present embodiment in that the second electrode 112 does not include a flat structure spanning two adjacent cavities.

Next, the manufacturing method for the pressure sensor 101 of the comparative example is briefly described with reference to FIGS. 23 and 24. As in FIGS. 7 to 22, FIGS. 23 and 24 illustrate a simplified model of a cross-section of a stack in the manufacturing process for the pressure sensor 101 to describe the manufacturing method.

In the manufacturing method for the pressure sensor 101 of the comparative example, first, insulating films 132 and 133, the first electrode 111, and the insulating film 134 are formed in order on the substrate 131. In FIG. 23, the area marked with a reference numeral 131a indicates a region of the substrate 131 where the impurity diffusion layer with high impurity concentration is formed. Next, a plurality of sacrificial layers 140 are formed on the insulating film 134. A shape of each of the plurality of sacrificial layers 140 corresponds to a shape of each of the plurality of cavities 121. Each of the plurality of sacrificial layers 140 is formed of silicon oxide.

Next, the second electrode 112 is formed to cover the plurality of sacrificial layers 140. Next, a plurality of vent holes 112a are formed in the second electrode 112. One vent hole 112a exposes a top surface of one sacrificial layer 140.

FIG. 23 shows the next step. In this step, the plurality of cavities 121 are formed by etching the plurality of sacrificial layers 140 and expelling the etched material through the plurality of vent holes 112a.

FIG. 24 shows the next step. In this step, sealing layers 135 are formed to seal the plurality of vent holes 112a in a vacuum. The subsequent steps are the same as those in the manufacturing method for the pressure sensor 1 according to the present embodiment.

Figure 25:
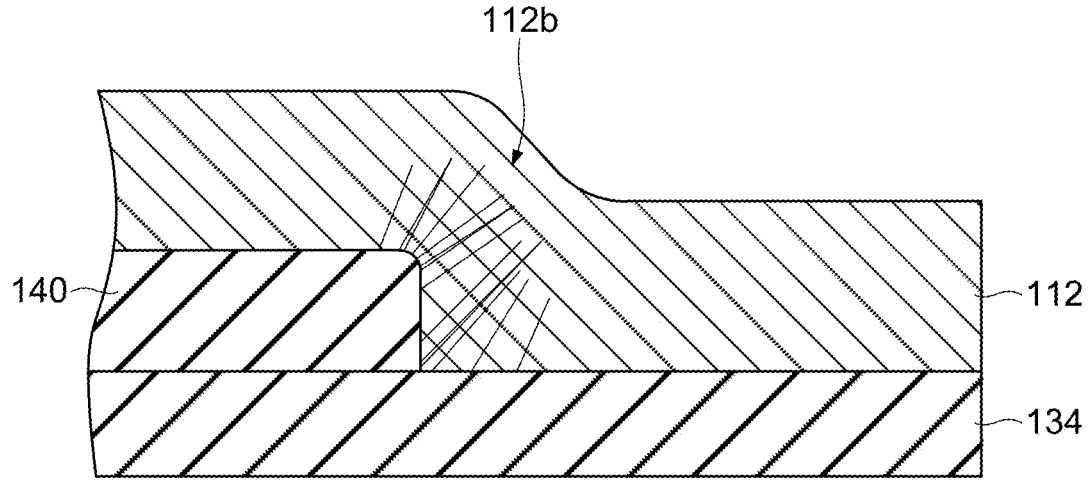
FIG. 25 is a cross-sectional view showing a part of a second electrode of a pressure sensor of a comparative example.
Figure 26:
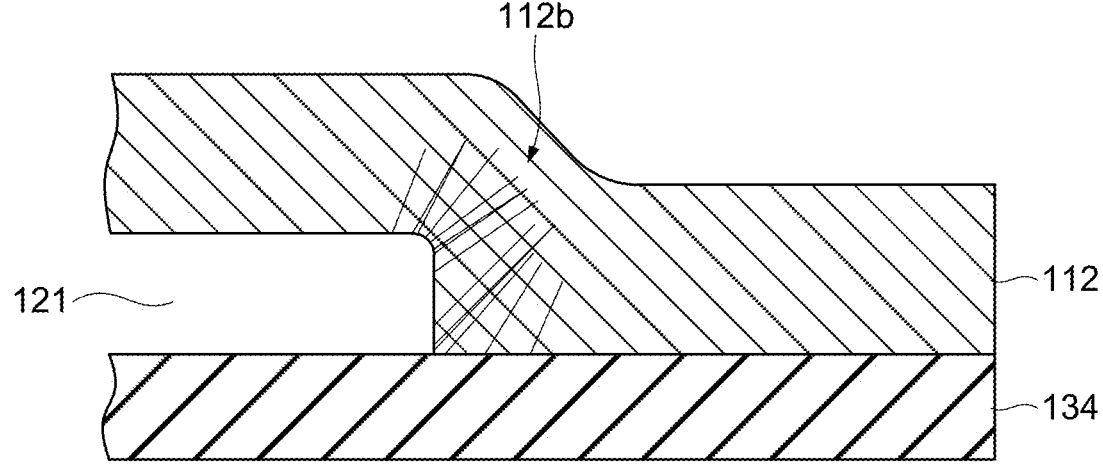
FIG. 26 is a cross-sectional view showing a part of a second electrode of a pressure sensor of a comparative example.

As shown in FIGS. 23 and 24, in the manufacturing method for the pressure sensor 101 of the comparative example, the plurality of sacrificial layers 140 corresponding to the plurality of cavities 121 are formed before the second electrode 112 is formed. Each of the plurality of sacrificial layers 140 has a step. The height of the steps is in the range of 200 nm to 500 nm, for example. Near the step, crystals of the polysilicon membrane forming the second electrode 112 grow in a tilted direction and in different grain sizes. FIGS. 25 and 26 each show a cross-sectional view of a portion of the second electrode 112. In FIGS. 25 and 26, the grain boundaries 112b are shown schematically. The growth of grain boundaries 112b as shown in FIGS. 25 and 26 causes a decrease in the mechanical strength of the polysilicon membrane.

In addition, each of the plurality of vent holes 112a is relatively small. Therefore, the flow rate of the etchant is reduced and the time required to remove the plurality of sacrificial layers 140 is long. Focusing on one sacrificial layer 140, etching of the one sacrificial layer 140 proceeds from the vent hole 112a in a direction parallel to the top surface of the substrate 131. The time required to remove the sacrificial layer 140 is 4 to 5 hours, for example. As the time required to remove the one sacrificial layer 140 becomes longer, the etchant penetrates into the grain boundaries 112b of the polysilicon membrane, causing a decrease in the mechanical strength of the polysilicon membrane.

In the comparative example, the performance of the pressure sensor is not stable due to poor reproducibility of each of the growth direction and the grain size.

In contrast, in the example approaches described above, the tunnel-like spaces 21s are formed between the insulating film 33 and the first layer 41 by first etching the second layer 42, which has a larger etching rate than the first layer 41, as described above. As a result, according to the example approaches, the area of the surface of the first layer 41, which is exposed to the etchant, can be increased, and as a result, the first layer 41 can be removed in a short time. The time required to remove the sacrificial layer 40 is 30 to 60 minutes, for example. As a result, according to the example illustrations, the time in which the polysilicon membrane 12P forming the second electrode 12 is exposed to the etchant can be shortened, and the mechanical strength of the polysilicon membrane 12P can be suppressed from decreasing.

According to the example approaches herein, the flat structure of the second electrode 12 can suppress the variation in the size of crystal grains as well as the variation in the direction of crystal growth. As a result, according to the present embodiment, the mechanical strength of the second electrode 12 can be suppressed from decreasing, and the second electrode 12 with stable internal stress can be achieved.

As described above, according to the example approaches, a pressure sensor 1 with high stability can be achieved.

Next, a second embodiment will be described, with reference to FIG. 27. In the present embodiment, the second electrode 12 includes an electrode layer 12A and a support layer 12B disposed between the electrode layer 12A and the plurality of cavities 21. One of the electrode layer 12A and the support layer 12B may be formed preferably by a material having a compressive stress, while the other may be formed preferably by a material having a tensile stress. In one example, the electrode layer 12A is formed by a polysilicon membrane with a compressive stress, and the support layer 12B is formed by silicon nitride with a tensile stress.

Figure 27:
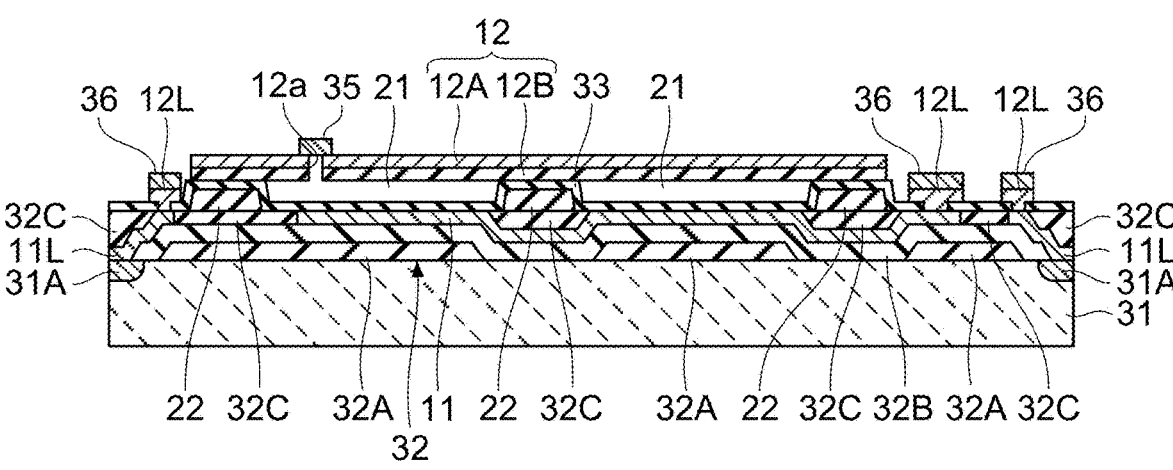
FIG. 27 is a schematic cross-sectional view showing a step of a manufacturing method for a pressure sensor according to an embodiment of the present disclosure.

According to the example illustrated in FIG. 27, an internal stress of the entire second electrode 12 can be reduced by combining a material with a compressive stress and a material with a tensile stress. As a result, according to the present example, a bending characteristics of the second electrode 12 can be improved and a mechanical strength of the second electrode 12 can be increased.

FIG. 27 is a schematic cross-sectional view of one step in the manufacturing method for the pressure sensor 1 according to the present example. The step shown in FIG. 27 corresponds to the step shown in FIG. 21 in the first example approach. As in FIG. 21, FIG. 27 illustrates a simplified model of a cross-section of a stack in the manufacturing method for pressure sensor 1 in order to describe the manufacturing method.

As shown in FIG. 27, in the present example, each of the plurality of cavities 21 is surrounded by the insulating film 33 and the support layer 12B. When the insulating film 33 and the support layer 12B are each formed by silicon nitride, each of the plurality of cavities 21 can be said to be surrounded by a plurality of silicon nitride films.

As shown in FIG. 27, in the present example, each of the electrode layer 12A and the support layer 12B includes a flat structure spanning two adjacent cavities 21 of the plurality of cavities 21. The flat structure of each of the electrode layer 12A and the support layer 12B may be parallel to the top surface of the substrate 31 when no pressure is applied to the second electrode 12. The entirety of the electrode layer 12A may have the flat structure, or most of the electrode layer 12A may have the flat structure. Similarly, the entirety of the support layer 12B may have the flat structure, or most of the support layer 12B may have the flat structure.

The manufacturing method for pressure sensor 1 according to the present example may basically be the same as the manufacturing method for the pressure sensor 1 according to the first embodiment. In one example, the electrode layer 12A is formed by the polysilicon membrane 12P and the support layer 12B is formed by a silicon nitride film. The silicon nitride film is formed after the step shown in FIG. 17, before forming the polysilicon membrane 12P. The silicon nitride film is formed on the flat top surface of the structure constituted of the spacer 22, insulating film 33, and sacrificial layer 40. The portion of the polysilicon membrane 12P, which will later become the electrode layer 12A, is formed on a flat top surface of the silicon nitride film. Each of the plurality of vent holes 12a penetrates through the electrode layer 12A and the silicon nitride film.

The other configuration, function, and effects of the present embodiment are consistent with those of the first embodiment.

Next, a third embodiment will be described, referring to FIGS. 28-33. First, a structure of the pressure sensor 1 according to the present example will be briefly described. In the present example, the second electrode 12 includes, in addition to the flat structure, a stepped portion 12b that is closer to the first electrode 11 than the flat structure. Most of the second electrode 12 has the flat structure. The stepped portion 12b of the second electrode 12 may be located only near an outer edge of the second electrode 12 or may be located outside the vicinity of the outer edge of the second electrode 12.

Next, the manufacturing method for the pressure sensor 1 according to the present example will be described with reference to FIGS. 28 to 33. FIGS. 28 to 33 illustrate a simplified model of a cross-section of a stack of the pressure sensor 1 in the manufacturing process to describe the manufacturing method, according to this example approach. FIGS. 28 to 33 are not illustrated with the intention of limiting the number and positioning of the multiple components of the pressure sensor 1.

Figure 28:
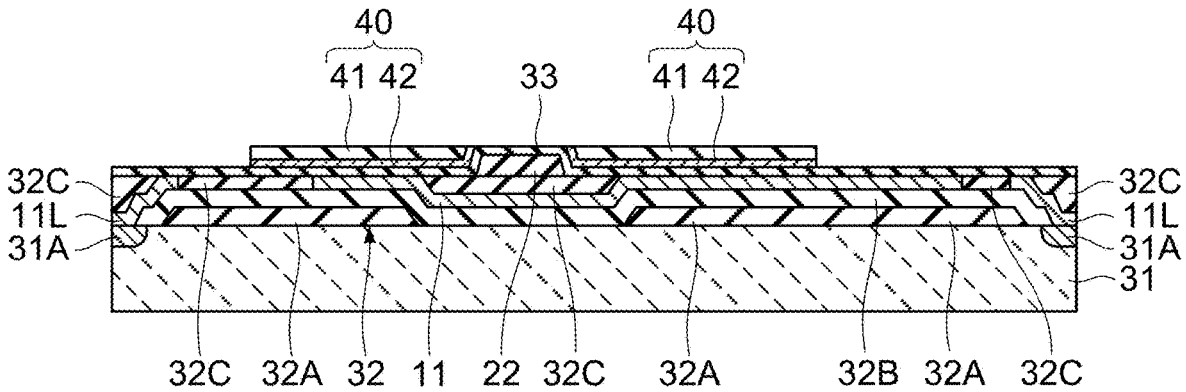
FIG. 28 is a schematic cross-sectional view showing a step of a manufacturing method for a pressure sensor according to an embodiment of the present disclosure.

The manufacturing method for the pressure sensor 1 according to the present embodiment, at least in some examples, is the same as that in the first embodiment up to the step shown in FIG. 16. FIG. 28 shows the next step of the step shown in FIG. 16. In this step, first, the first layer 41 is etched by, for example, RIE with a photoresist mask patterned by photolithography to remove portions of the first layer 41 that are located in areas other than the area where the plurality of cavities 21 will later be formed. Now, focus is placed on a portion of the first layer 41 disposed in the area where one cavity 21 will later be formed. An outer edge of this portion may be adjacent to the spacer 22 in its entirety or may include a portion not adjacent to the spacer 22. Next, a portion of the second layer 42 that is not covered with the first layer 41 is removed by wet etching, for example.

Figure 29:
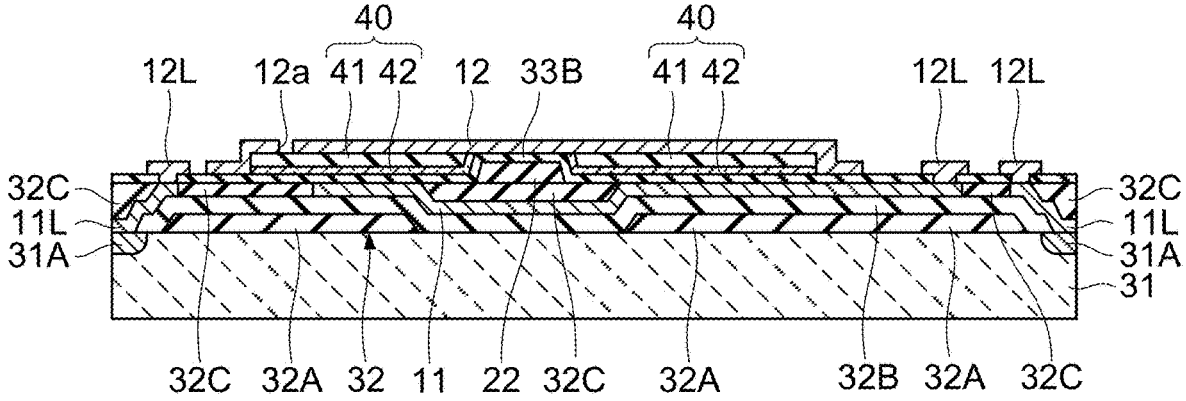
FIG. 29 is a schematic cross-sectional view showing a step of a manufacturing method for a pressure sensor according to an embodiment of the present disclosure.
Figure 30:
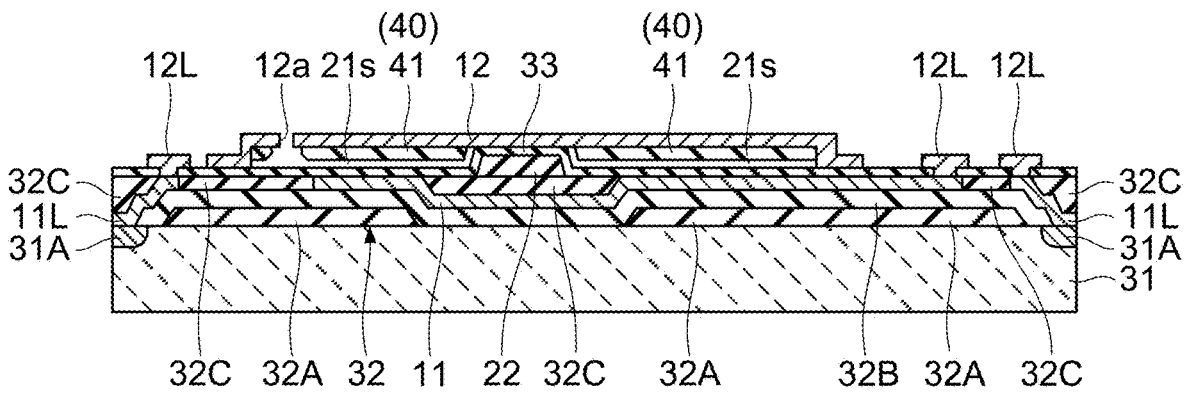
FIG. 30 is a schematic cross-sectional view showing a step of a manufacturing method for a pressure sensor according to an embodiment of the present disclosure.
Figure 31:
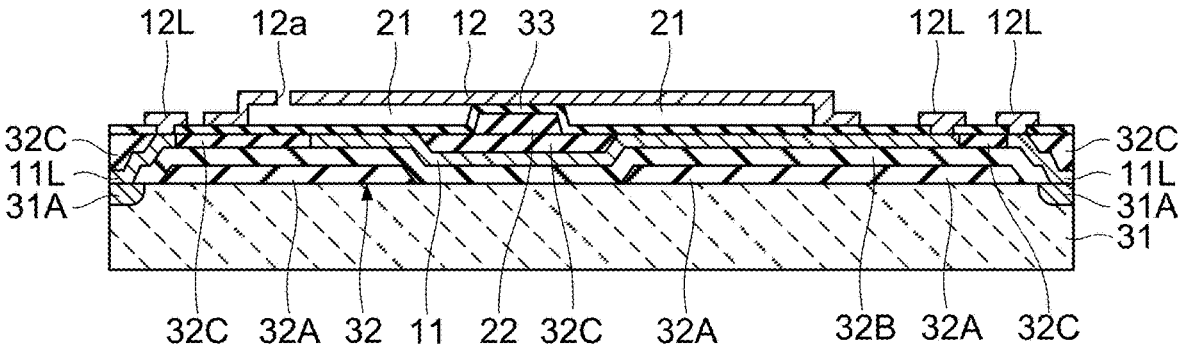
FIG. 31 is a schematic cross-sectional view showing a step of a manufacturing method for a pressure sensor according to an embodiment of the present disclosure.
Figure 32:
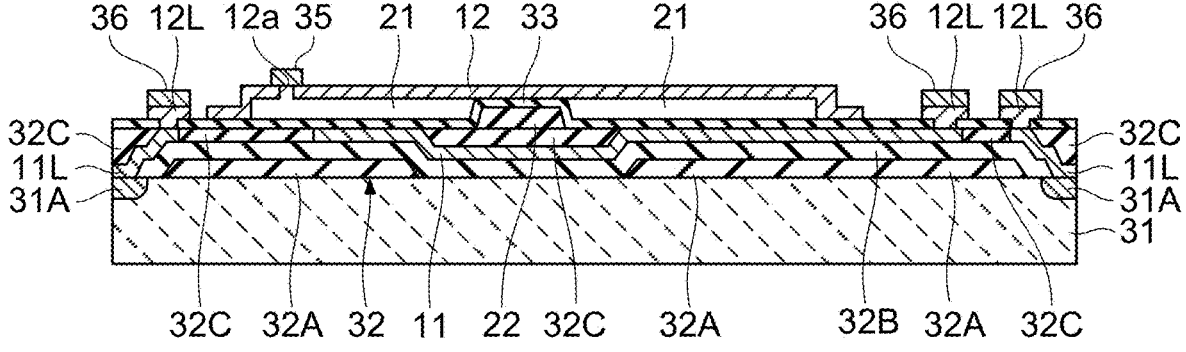
FIG. 32 is a schematic cross-sectional view showing a step of a manufacturing method for a pressure sensor according to an embodiment of the present disclosure.
Figure 33:
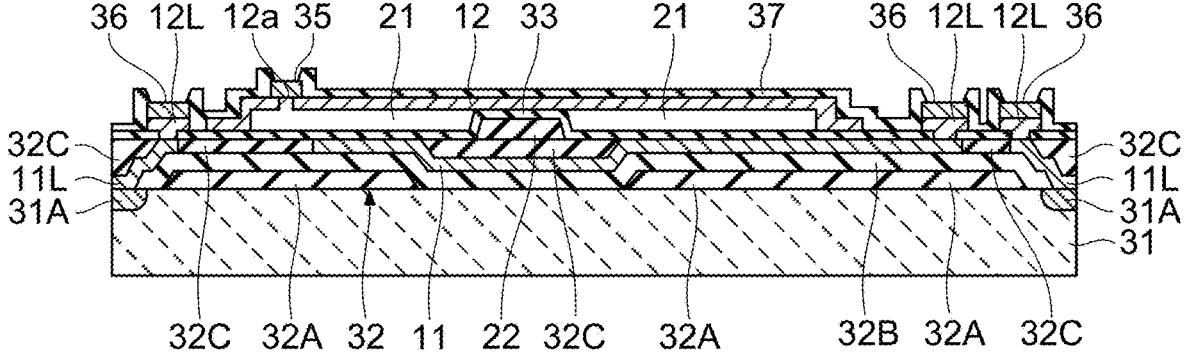
FIG. 33 is a schematic cross-sectional view showing a step of a manufacturing method for a pressure sensor according to an embodiment of the present disclosure.

FIG. 29 shows a step that may follow that illustrated in FIG. 28. In this step, first, the insulating film 33B is selectively etched by, for example, RIE with a photoresist mask patterned by photolithography to form a first opening to expose a top surface of the first electrode 11 and a plurality of second openings to expose top surfaces of the line layers 11L.

Next, a material constituting the second electrode 12 may be formed on the top surface of the stack. Here, the case in which the second electrode 12 is formed by a polysilicon membrane 12P will be described as an example. The polysilicon membrane 12P is formed on the first electrode 11, the insulating film 33, and the sacrificial layer 40. Most of the polysilicon membrane 12P that later becomes the second electrode 12 is formed on a flat top surface of the structure constituted of the spacer 22, the insulating film 33, and the sacrificial layer 40. The polysilicon membrane 12P contacts the top surface of the first electrode 11 through the first opening of the insulating film 33 and contacts the top surfaces of the line layers 11L through the plurality of second openings of the insulating film 33.

Next, impurities may be diffused into the polysilicon membrane 12P. Next, the stack is annealed. Next, the polysilicon membrane 12P is selectively etched by, for example, RIE with a photoresist mask patterned by photolithography so that the polysilicon membrane 12P becomes the second electrode 12, and a plurality of vent holes 12a are formed in the second electrode 12 to expose a top surface of the sacrificial layer 40. A portion of the polysilicon membrane 12P after the etching, which is disposed on the insulating film 33 and the sacrificial layer 40, becomes the second electrode 12. In the present embodiment, in particular, this portion covers the step formed between a top surface of the insulating film 33, other than a portion disposed over the spacer 22, and a top surface of the sacrificial layer 40. Portions of the polysilicon membrane 12P after the etching, other than the second electrode 12, become line layers 12L.

In at least some example approaches, the subsequent steps are the same as those in the first embodiment. The steps shown in FIGS. 30 to 33 correspond to the steps shown in FIGS. 19 to 22 in the first embodiment. Since the contents of the steps shown in FIGS. 30 to 33 are the same as those shown in FIGS. 19 to 22, the description is omitted.

The other configuration, function, and effects of the present embodiment are the same as those of the first or second embodiment.

Note that the scope of the present invention is not limited to the foregoing embodiments, and various modifications may be made thereto. For example, a number, shape and arrangement of the plurality of cavities 21 are arbitrary and not limited to the examples shown in each embodiment.

As described above, the pressure sensor according to one embodiment includes: a first electrode; a plurality of cavities; and a second electrode disposed opposite the first electrode through the plurality of cavities and including a flat structure spanning two adjacent cavities of the plurality of cavities.

In the pressure sensor according to one embodiment, the first electrode may be formed of a polysilicon membrane. The first electrode may include a first portion and a second portion closer to the second electrode than the first portion.

In the pressure sensor according to an embodiment, the second electrode may be formed of a polysilicon membrane.

In the pressure sensor according to one embodiment, the second electrode may include a polysilicon membrane and a silicon nitride film. A thickness of the silicon nitride film may be smaller than a thickness of the polysilicon membrane.

The pressure sensor according to an embodiment may further include a spacer dividing the plurality of cavities and formed of silicon nitride.

The pressure sensor according to one embodiment may further include a polysilicon membrane and a silicon nitride film that surround each of the plurality of cavities.

The pressure sensor according to one embodiment may further include a plurality of silicon nitride films surrounding each of the plurality of cavities.

The pressure sensor manufactured by the manufacturing method according to one embodiment includes: a first electrode; a cavity; and a second electrode disposed opposite the first electrode through the cavity. The manufacturing method according to one embodiment includes: forming the first electrode; forming a sacrificial layer over the first electrode; forming the second electrode over the sacrificial layer;

forming a vent hole in the second electrode, to expose a top surface of the sacrificial layer; and forming the cavity by etching the sacrificial layer and expelling an etched material from the vent hole. The sacrificial layer includes a first layer, and a second layer disposed between the first electrode and the first layer and having a higher etching rate than the first layer.

In the manufacturing method according to one embodiment, the second layer may be formed of phosphorus silicate glass. The first layer may be formed of silicon oxide.

In the manufacturing method according to one embodiment, the second layer may be formed of silicon oxide.

In the manufacturing method according to one embodiment, the sacrificial layer may further include a third layer disposed between the first electrode and the second layer, and having a smaller etching rate than the second layer.

In the manufacturing method according to one embodiment, the pressure sensor may further include: a substrate; and an insulating film disposed between the substrate and the first electrode, and having an opening to expose a top surface of the substrate. The manufacturing method according to one embodiment may further include forming the insulating film over the substrate before forming the first electrode. Forming the first electrode may include forming a polysilicon membrane over the insulating film so as to contact the top surface of the substrate exposed through the opening, and diffusing impurities into the polysilicon membrane. The substrate may be an N-type silicon substrate.

In the manufacturing method according to one embodiment, the pressure sensor may further include an insulating film disposed between the first electrode and the second electrode, the insulating film having an opening to expose a top surface of the first electrode. The manufacturing method according to one embodiment may further include forming the insulating film over the first electrode before forming the second electrode. Forming the second electrode may include forming a polysilicon membrane over the insulating film so as to contact the top surface of the first electrode exposed through the opening, and diffusing impurities into the polysilicon membrane. The first electrode may be formed of a polysilicon membrane.

In the manufacturing method according to one embodiment, the pressure sensor may further include a spacer surrounding the cavity and formed of silicon nitride. The manufacturing method according to one embodiment may further include forming the spacer over the first electrode before forming the sacrificial layer.

In the manufacturing method according to one embodiment, the pressure sensor may further include a plurality of silicon nitride films surrounding the cavity. The manufacturing method according to one embodiment may further include forming the plurality of silicon nitride films. Forming the plurality of silicon nitride films may include forming a first silicon nitride film over the first electrode before forming the sacrificial layer, and forming a second silicon nitride film over the sacrificial layer before forming the second electrode.

Many modifications and variations of the present invention are possible in the light of the above teachings. Thus, it is to be understood that, within the scope of the appended claims and equivalents thereof, the present invention may be practiced in other than the foregoing embodiments.

What is claimed is:
1. A pressure sensor comprising:
a first electrode;
a plurality of cavities; and a second electrode disposed opposite the first electrode through the plurality of cavities and including a single, continuous flat structure spanning at least two adjacent cavities of the plurality of cavities.

2. The pressure sensor according to claim 1, wherein the first electrode is formed of a polysilicon membrane.

3. The pressure sensor according to claim 1, wherein the first electrode includes a first portion and a second portion closer to the second electrode than the first portion.

4. The pressure sensor according to claim 1, wherein the second electrode is formed of a polysilicon membrane.

5. The pressure sensor according to claim 1, wherein the second electrode includes a polysilicon membrane and a silicon nitride film.

6. The pressure sensor according to claim 5, wherein a thickness of the silicon nitride film is smaller than a thickness of the polysilicon membrane.

7. The pressure sensor according to claim 1, further comprising a spacer dividing the plurality of cavities and formed of silicon nitride.

8. The pressure sensor according to claim 1, further comprising a polysilicon membrane and a silicon nitride film that surround each of the plurality of cavities.

9. The pressure sensor according to claim 1, further comprising a plurality of silicon nitride films surrounding each of the plurality of cavities.

10. A manufacturing method for a pressure sensor, the pressure sensor comprising a first electrode, a plurality of cavities, and a second electrode disposed opposite the first electrode through the cavity, the manufacturing method comprising:
forming the first electrode;
forming a sacrificial layer over the first electrode;
forming the second electrode over the sacrificial layer;
forming a vent hole in the second electrode, to expose a top surface of the sacrificial layer; and
forming the plurality of cavities by etching the sacrificial layer and expelling an etched material from the vent hole, wherein the sacrificial layer includes a first layer, and a second layer disposed between the first electrode and the first layer and having a higher etching rate than the first layer, the second electrode including a single, continuous flat structure spanning at least two adjacent cavities of the plurality of cavities.

11. The manufacturing method according to claim 10, wherein the second layer is formed of phosphorus silicate glass.

12. The manufacturing method according to claim 10, wherein the first layer is formed of silicon oxide.

13. The manufacturing method according to claim 10, wherein the second layer is formed of silicon oxide.

14. The manufacturing method according to claim 10, wherein the sacrificial layer further includes a third layer disposed between the first electrode and the second layer, the third layer having a smaller etching rate than the second layer.

15. The manufacturing method according to claim 10, wherein the pressure sensor further comprises:
a substrate; and
an insulating film disposed between the substrate and the first electrode, and having an opening to expose a top surface of the substrate,
the manufacturing method further comprising forming the insulating film over the substrate before forming the first electrode;
wherein forming the first electrode includes forming a polysilicon membrane over the insulating film so as to contact the top surface of the substrate exposed through the opening, and diffusing impurities into the polysilicon membrane.

16. The manufacturing method according to claim 15, wherein the substrate is an N-type silicon substrate.

17. The manufacturing method according to claim 10, wherein the pressure sensor further comprises an insulating film disposed between the first electrode and the second electrode, the insulating film having an opening to expose a top surface of the first electrode;

the manufacturing method further comprising forming the insulating film over the first electrode before forming the second electrode;

wherein forming the second electrode includes forming a polysilicon membrane over the insulating film so as to contact the top surface of the first electrode exposed through the opening, and diffusing impurities into the polysilicon membrane.

18. The manufacturing method according to claim 17, wherein the first electrode is formed of a polysilicon membrane.

19. The manufacturing method according to claim 10, wherein the pressure sensor further comprising a spacer surrounding the cavity and formed of silicon nitride, silicon oxide or aluminum oxide;

the manufacturing method further comprising forming the spacer over the first electrode before forming the sacrificial layer.

20. The manufacturing method according to claim 10, wherein the pressure sensor further comprising a plurality of silicon nitride films surrounding the cavity, the manufacturing method further comprising forming the plurality of silicon nitride films;

wherein forming the plurality of silicon nitride films includes forming a first silicon nitride film over the first electrode before forming the sacrificial layer, and forming a second silicon nitride film over the sacrificial layer before forming the second electrode.

* * * * *